(12) United States Patent
Ho et al.

(10) Patent No.: US 7,684,234 B2
(45) Date of Patent: *Mar. 23, 2010

(54) METHODS AND APPARATUS FOR THERMALLY ASSISTED PROGRAMMING OF A MAGNETIC MEMORY DEVICE

(75) Inventors: Chiahua Ho, Kaohsiung (TW); Kuang-Yeu Hsieh, Hsin Chu (TW)

(73) Assignee: Macronix International Co., Ltd. (TW)

( * ) Notice: Subject to any disclaimer, the term of this patent is extended or adjusted under 35 U.S.C. 154(b) by 8 days.

This patent is subject to a terminal disclaimer.

(21) Appl. No.: 12/252,263

(22) Filed: Oct. 15, 2008

(65) Prior Publication Data

US 2009/0034326 A1    Feb. 5, 2009

Related U.S. Application Data

(63) Continuation of application No. 11/381,939, filed on May 5, 2006, now Pat. No. 7,457,149.

(51) Int. Cl.
*G11C 11/00* (2006.01)

(52) U.S. Cl. ................. 365/158; 365/171; 365/173

(58) Field of Classification Search ........... 365/171, 365/158, 173; 257/E21.665
See application file for complete search history.

(56) References Cited

U.S. PATENT DOCUMENTS

| | | | |
|---|---|---|---|
| 6,819,587 B1 | 11/2004 | Sharma | |
| 6,865,105 B1 | 3/2005 | Tran | |
| 6,980,468 B1 | 12/2005 | Ounadjela | |
| 7,092,283 B2 | 8/2006 | Jeong et al. | |
| 7,110,287 B2 * | 9/2006 | Huai et al. | 365/171 |
| 7,286,395 B2 | 10/2007 | Chen et al. | |
| 7,323,732 B2 * | 1/2008 | Ho et al. | 257/295 |
| 7,362,644 B2 * | 4/2008 | Yang et al. | 365/225.5 |
| 7,453,720 B2 * | 11/2008 | Ju et al. | 365/158 |
| 7,457,149 B2 * | 11/2008 | Ho et al. | 365/158 |
| 2005/0180202 A1 | 8/2005 | Huai et al. | |

FOREIGN PATENT DOCUMENTS

| | | |
|---|---|---|
| CN | 1655278 | 8/2005 |
| TW | 541530 | 7/2003 |
| TW | 594786 | 6/2004 |
| TW | I222637 | 10/2004 |

* cited by examiner

*Primary Examiner*—David Lam
(74) *Attorney, Agent, or Firm*—Baker & McKenzie LLP

(57) ABSTRACT

A magnetic memory device comprises a magnetic memory cell that includes a pinned layer and a free layer separated from the pinned layer by an insulating layer. The magnetic memory device also comprises a thermal plate in contact with the free layer. The magnetic memory device can be configured so that a first current flows through the thermal plate heating the thermal plate. The magnetic behavior of the free layer can be altered due to the heating caused by the first current, making it easier to switch the orientation and magnetization of the free layer. A second current can then flow through a bit line near the free layer generating a magnetic field sufficient to switch the orientation of magnetization of the free layer.

19 Claims, 7 Drawing Sheets

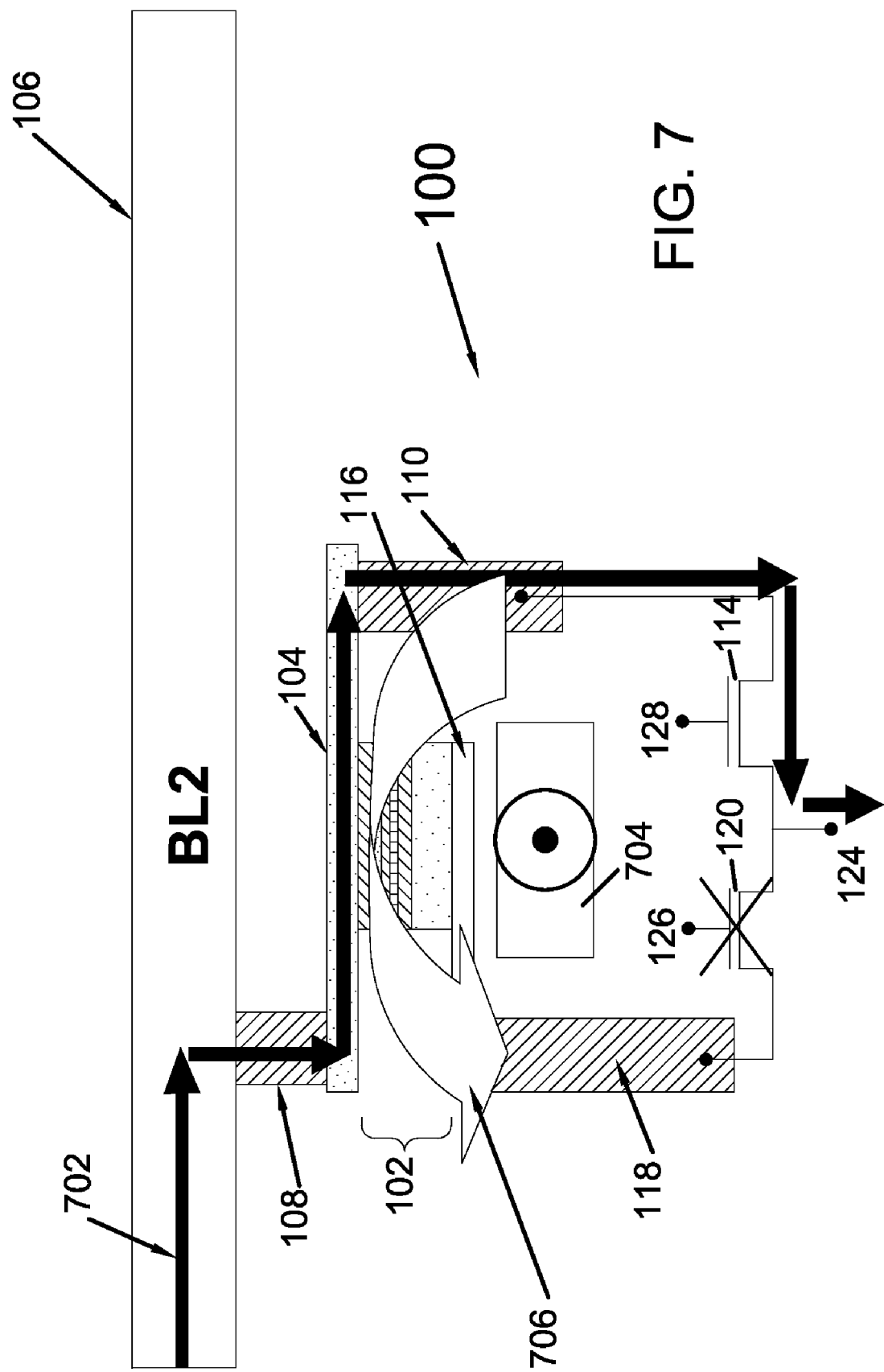

METHODS AND APPARATUS FOR THERMALLY ASSISTED PROGRAMMING OF A MAGNETIC MEMORY DEVICE

APPLICATION FOR CLAIM OF PRIORITY

This application claims priority as a Continuation under 35 U.S.C. §120 to U.S. patent application Ser. No. 11/381,939 filed May 5, 2006, now U.S. Pat. No. 7,457,149, and entitled "Methods and Apparatus for Thermally Assisted Programming of Magnetic Memory Device." The disclosure of the above identified application is incorporated herein by reference as if set forth in full.

BACKGROUND

1. Field of the Invention

The embodiments below relate generally to magnetic memory devices, and more particularly to thermally-assisted programming operations in magnetic memory devices.

2. Background of the Invention

Magnetic memory devices comprise one or more magnetic memory cells that include a magnetic media with a switchable orientation of magnetization. The ability to store data in magnetic media is dependent on the ability to control the orientation of magnetization of the magnetic media. The ability to change, or switch the orientation of magnetization of the magnetic media allows the storage of a data bit, i.e., a logic state of "0" or "1", within a magnetic memory cell. One orientation of magnetization for the magnetic memory cell can be equated with the logic "0", while the opposite orientation of magnetization can be equated with the logic "1".

The coercivity of a magnetic media is the level of demagnetizing force that must be applied to the magnetic media in order to reduce and/or reverse the orientation of magnetization of the magnetic media. Thus, a magnetic field sufficient to overcome the coercivity of the magnetic media included in a magnetic memory cell, must be applied in order to change the logic state of the magnetic memory cell from one state to the other. Generally, the smaller the magnetic media, the higher its coercivity and the higher magnetic field required to change logic states increases.

There are several known magnetic memory cells for use in magnetic memory devices, such as Magnetic Random Access Memory (MRAM) arrays, including the Tunneling Magneto-Resistant Memory (TMR) cell with or without Synthetic Anti-Ferromagnetic structure (SAF), the Giant Magneto-Resistant Memory (GMR) cell with or without Synthetic Anti-Ferromagnetic structure (SAF), and the Colossal Magneto-Resistance Memory (CMR) cell. Each of these memory cells comprises a data layer, which can also be referred to as a storage layer or bit layer, a reference layer, and an intermediate layer between the data layer and the reference layer. The data layer, reference layer, and intermediate layer can each be fabricated from one or more layers and material.

The data layer is usually a layer of magnetic material that stores a bit of data as an orientation of magnetization that may be altered in response to the application of an external magnetic field or fields as described above. In other words, the orientation of magnetization of the data layer representing the logic state can be rotated, or switched, from a first orientation representing a logic state of, e.g., "0" to a second orientation representing a logic state of, e.g., "1", and vice versa.

The reference layer is usually a layer of magnetic material in which an orientation of magnetization is "pinned", or fixed in a predetermined direction. Often, several layers of magnetic material are required and function as one to affect the stable pinned reference layer. The predetermined direction is establish by microelectronic processing steps employed in the fabrication of the magnetic memory cell.

Magnetic memory devices, such as MRAMs, often employ Magnetic Tunnel Junction (MTJ) memory cells comprising one of the memory cells described above positioned at the transverse intersections of electrically conductive rows and columns. Such an arrangement is often referred to as a cross point memory array.

The logic state of each cell in such a cross point array depends on the relative orientations of magnetization in the data layer and the reference layer. When an electrical potential bias is applied across the data layer and reference layer by application of appropriate voltages to the associated electrically conductive rows and columns, electrons migrate between the data layer and the reference layer to the intermediate layer. The phenomenon that causes the migration of electrons to the intermediate layer is referred to as quantum mechanical tunneling or spin tunneling. The logic state can then be determined by sensing the flow of electrons and measuring the resistance of the memory cell.

For example, if the overall orientation of the magnetization in the data storage layer is parallel to the pinned orientation of magnetization in the reference layer, then the magnetic memory cell will be in a state of low resistance. If the overall orientation of the magnetization of the data storage layer is anti-parallel, or opposite to the pinned orientation of the magnetization in the reference layer, then the magnetic memory cell will be in a state of high resistance. The low resistance state and high resistance state can then be associated with a logic state so that the logic state of the memory cell can be determined by sensing the current through the memory cell and measuring the associated resistance of the memory cell.

The electrically conductive rows and columns comprising a cross point memory array are typically referred to as word and bit lines. Thus the logic state of a targeted memory cell in a cross point array can be determined by selecting the appropriate word and bit line.

Magnetic memory devices typically comprise additional bit lines that can be used to alter the orientation of magnetization of one or more of the magnetic memory cells comprising cross point array when the appropriate voltages are applied to the word and bit lines associated with the target memory cell. Current flowing in these additional bit lines generate a magnetic field around the bit line. The direction of this magnetic field, can influence the orientation of magnetization of the target memory cell. If the magnetic fields created by the current flowing in one of these bit lines is of sufficient strength, then it can overcome the coercivity of the target memory cell and rotate or switch the orientation of magnetization of the target memory cell.

Accordingly, in order to change the logic state of the magnetic memory cell, the additional bit lines must be sufficiently close to the magnetic memory cells, such that the magnetic field created by current flow in the additional bit lines can influence the orientation of magnetization of the memory cell. Additionally, sufficiently high currents must be used in order to create a magnetic field with sufficient strength to overcome the coercivity of the magnetic memory cell.

Altering the direction of the current flowing in the additional bit lines, will change the direction of the magnetic field it creates, which can cause the orientation of magnetization of the memory to be switched in the other direction.

Write, or program operations generally require greater electrical current and magnetic fields relative to read operations. The greater electrical currents also require more robust characteristics in the power supply and larger switching transistors. The greater electrical current and magnetic field also require an appropriate buffering space between neighboring cells. This is because it is undesirable to adversely affect the data layers of neighboring cells, when programming a logic state of a target cell. As a result, designer manufacturing issues are generally focused upon requirements proposed by the write operation.

Because the coercivity of magnetic memory devices is increasing due to the reduction in size of such devices, larger power sources and larger switching transistors are required in order to provide the current need to overcome the coercivity of the memory cells. The larger currents generated by these larger power sources and larger switching transistors has the potential to affect the state of neighboring memory cells. Accordingly, as magnetic memory devices shrink, a more and more significant amount of the overall space of the memory device is used to provide physical buffering between memory cells. Absent this buffering space, greater "cross talk" issues would arise.

All of these issues make achieving small, compact, highly dense magnetic memory devices difficult. In other words, the inclusion of additional bit lines for programming the memory cells, larger power sources, larger switching transistors, and increased isolation space, all transpire to reduce the density achievable in conventional magnetic memory devices. Increasing the density, e.g., at the expense of isolation space, increases the risks and problems associated with cross talk between memory cells.

Moreover, the larger power sources and switching transistors needed to provide the sufficient current to overcome the coercivity of the smaller memory cells, increase its power consumption for conventional magnetic memory devices. It will be understood that the increase power consumption is generally not desirable, especially for the increasing number of portable applications.

SUMMARY

A magnetic memory device comprises a magnetic memory cell that includes a pinned layer and a free layer separated from the pinned layer by an insulating layer. The magnetic memory device also comprises a thermal plate. The thermal plate is in contact with the free layer. The magnetic memory device can be configured so that a first current flows through the thermal plate heating the thermal plate. The magnetic behavior of the free layer can be altered due to the heating caused by the first current. The altered magnetic behavior can make it easier to switch the orientation and magnetization of the free layer. A second current can then flow through a bit line near the free layer generating a magnetic field sufficient to switch the orientation of magnetization of the free layer. Because of the heating, a smaller current can be used to switch the orientation of magnetization of the free layer, which reduces the power consumption for the device, can help increase density, and can increase isolation or reduce cross talk between memory cells.

In one aspect, the thermal plate is formed from an anti-ferromagnetic material.

In another aspect, the magnetic memory cell can further comprise a pinning layer used to pin the orientation of magnetization of the pinned layer. The pinning layer can comprise an anti-ferromagnetic material and a synthetic anti-ferromagnetic film. The pinned layer can comprise a 3d transition magnetic material.

In still another aspect, the free layer can also comprise a 3d transition magnetic material.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 7 is a diagram illustrating an example process for programming the magnetic memory state of the magnetic memory cell included in the magnetic memory device of FIG. 1 to the opposite state as that in FIG. 6.

DETAILED DESCRIPTION OF THE PREFERRED EMBODIMENTS

The embodiments below are generally directed to MRAM devices; however, it will be understood that the methods and devices described herein are not necessarily limited to MRAM devices and can apply more generally to any type of magnetic memory device. Accordingly, the inventions subscribed herein should not be seen as limited to the specific embodiments described below.

In the embodiments described below, a magnetic memory device includes a MTJ memory cell comprising a pinning layer, a pinned layer, and a free layer separated from the pinned layer by an insulating layer. The magnetic memory cell also comprises a thermal plate coupled with the free layer. The thermal plate can be heated via a current flowing through the thermal plate. The thermal plate can, as described below, be heated sufficiently so as to alter the magnetic behavior of the free layer making it easier to change the orientation of magnetization of the free layer. As a result, the orientation of magnetization of the free layer can be altered using smaller currents.

The ability to more easily alter the orientation of magnetization, or program the state of the free layer can not only reduce the programming current required, but can also reduce the size of the power supply and switching transistors needed to program the magnetic memory cell. Accordingly, the isolation areas between cells can be reduced. Cross-talk can also be reduced, all of which allows for denser magnetic memory devices. Additionally, the stability of the programmed state of the cell can be improved.

Figure 1:
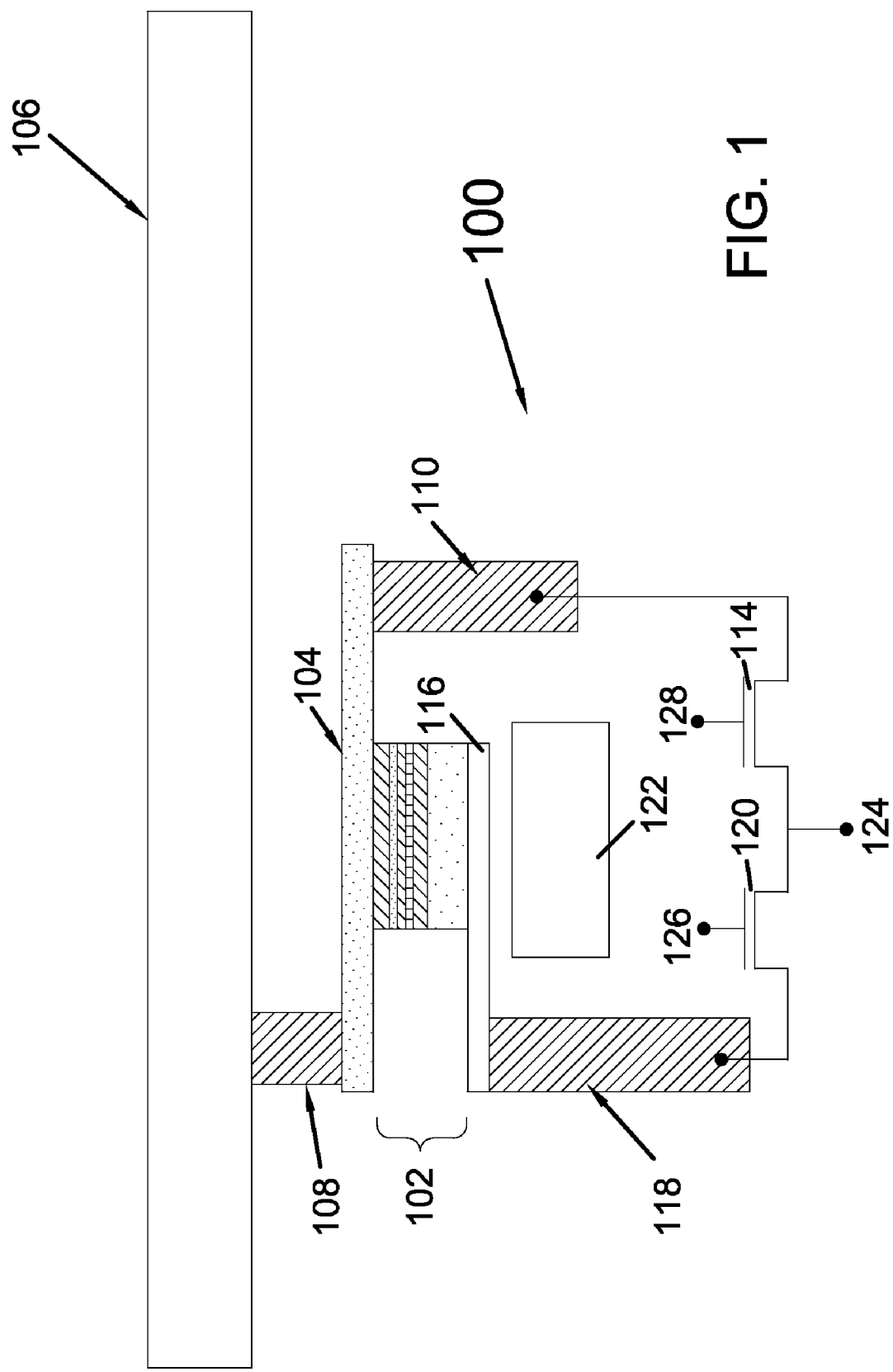
FIG. 1 is a diagram illustrating a magnetic memory device configured in accordance with one embodiment.

FIG. 1 is a diagram illustrating an MRAM device 100 configured in accordance with one embodiment. MRAM device 100 comprises an MTJ cell 102 as illustrated. As will be described in more detail below, MTJ cell 102 comprises a free layer in contact with a thermal plate 104. One end of thermal plate 104 can be connected with a bit line 106 through a via 108. The other end of thermal plate 104 can be connected via connector 110 with a first word line transistor 114. MTJ 102 can be coupled with an electrode 116 on the opposite end of the MTJ 102 from thermal plate 104. Electrode 116 can be coupled with the drain of a second word line transistor 120 through a connector 118. Word line transistors 114 and 120 can comprise a common source node 124 as illustrated. The gates of word line transistors 114 and 120 can be coupled with word lines 126 and 128, respectively.

MRAM device 100 can also comprise a second bit line 122 in close proximity with MTJ cell 102. As will be described below, bit line 122 can be used to program the state of MTJ cell 102.

Figure 2:
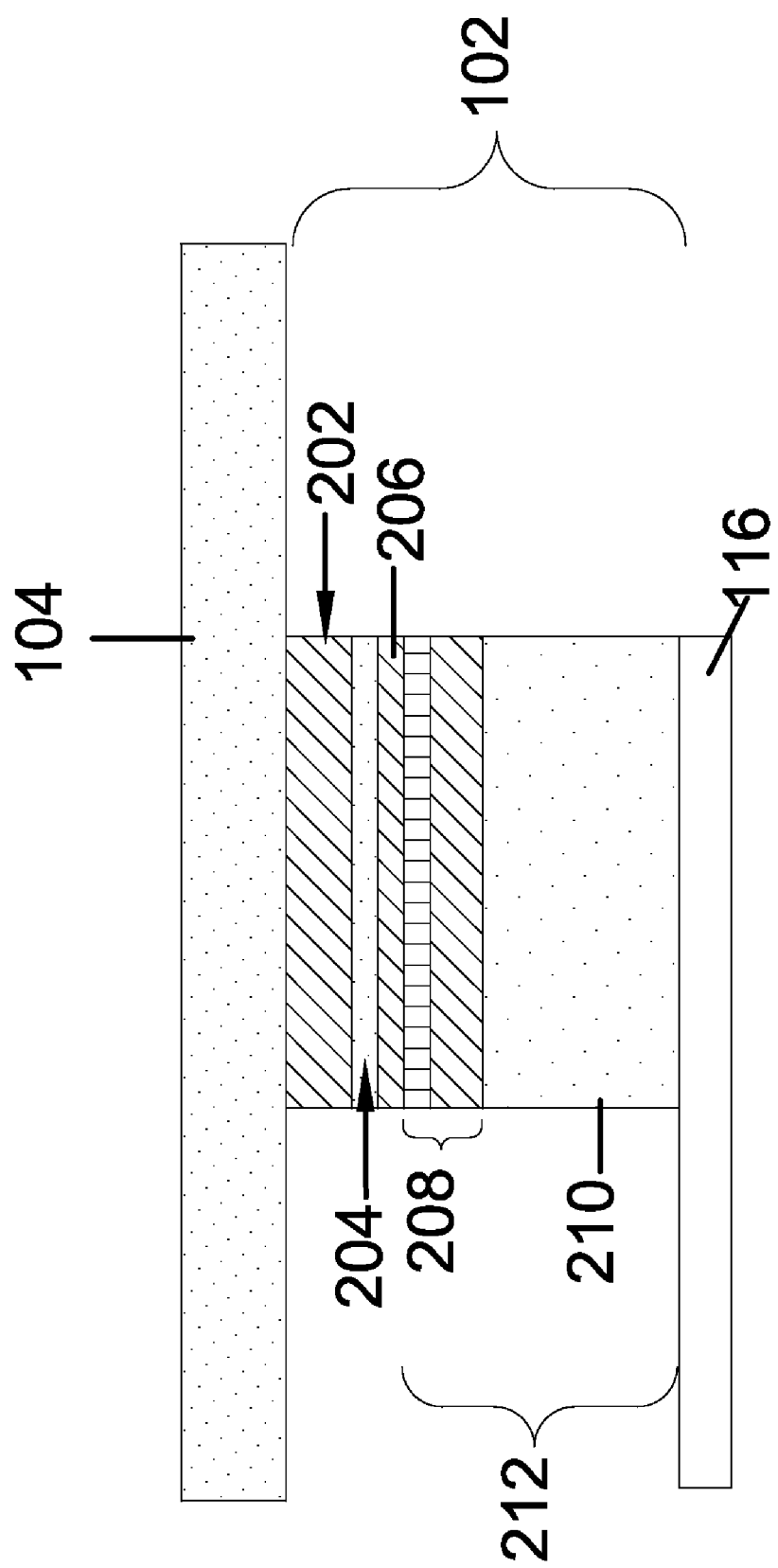
FIG. 2 is a diagram illustrating a close up view of a magnetic memory cell comprising part of the magnetic memory device of FIG. 1.

FIG. 2 is a diagram illustrating a close up view of MTJ cell 102. As can be seen, MTJ cell 102 can comprise a pinning layer 212, a pinned layer 206, an insulator 204 and a free layer, or data layer 202. In the embodiment illustrated in FIG. 2, pinning layer 212 comprises an anti-ferromagnetic layer 210 and a SAF layer 208. Anti-ferromagnetic layer 210 can comprise anti-ferromagnetic material such as FeMn, PtMn, etc. SAF layer 208 can comprise a synthetic anti-ferromagnetic film, such as CoFe/Ru/CoFe.

It will be understood, that the embodiments described herein are not limited to the use of SAF films for pinning layer 212. Further, anti-ferromagnetic layer 210 may or may not be included in MTJ 102 depending on the embodiment.

Pinning layer 212 can, depending on the embodiment, be anywhere from approximately 5 to approximately 80 nanometers thick.

Pinned layer 206 can comprise a 3d transition magnetic material, such as CoFe. Depending on the embodiment, pinned layer 206 can be anywhere from approximately 1 to approximately 20 nanometers (nm) thick.

Insulator 204 can comprise a thin layer of an insulating material such as Al—O, MgO, etc. Insulator 204 can, depending on the embodiment, be anywhere from approximately 0.7 to 3 (nm) thick.

Free layer 202 can also comprise a 3d transition magnetic material, such as CoFe. Free layer 202 can, depending on the embodiment, be anywhere from approximately 1 to approximately 20 (nm) thick.

Electrode 116 can comprise a conductive metal layer. Similarly, via 108, contacts 110 and 118, and bit lines 106 and 122 can all comprise a conductive metal material.

Thermal plate 104 can, depending on the embodiment, comprise an anti-ferromagnetic material or an anti-ferromagnetic/non-magnetic material. For example, thermal plate 104 can comprise XMn or XMn/Y, wherein X=Pt, Ir, or Fe, etc., and Y=Ru, or Ir, etc.

It will be understood that the anti-ferromagnetic properties of thermal plate 104 will help to pin the orientation of magnetization of free layer 202 to its existing orientation. The pinning of free layer 202 will make the state of MTJ cell 102 more stable; however, it also makes it more difficult to overcome the coercivity of free layer 202 in order to switch the orientation. Accordingly, a large current would be required in order to switch the state of free layer 202. In the embodiments described herein, however, thermal plate 104 is heated via a current that flows through thermal plate 104. The current flowing through thermal plate 104 is of sufficient magnitude to raise the temperature of thermal plate 104 above a certain threshold, e.g., its Néel temperature or blocking temperature, at which point thermal plate 104 will act as a paramagnet. Accordingly, thermal plate 104 will no longer pin free layer 202 to its existing state and a lower magnetic field can be used to switch the state of free layer 202.

Figure 3:
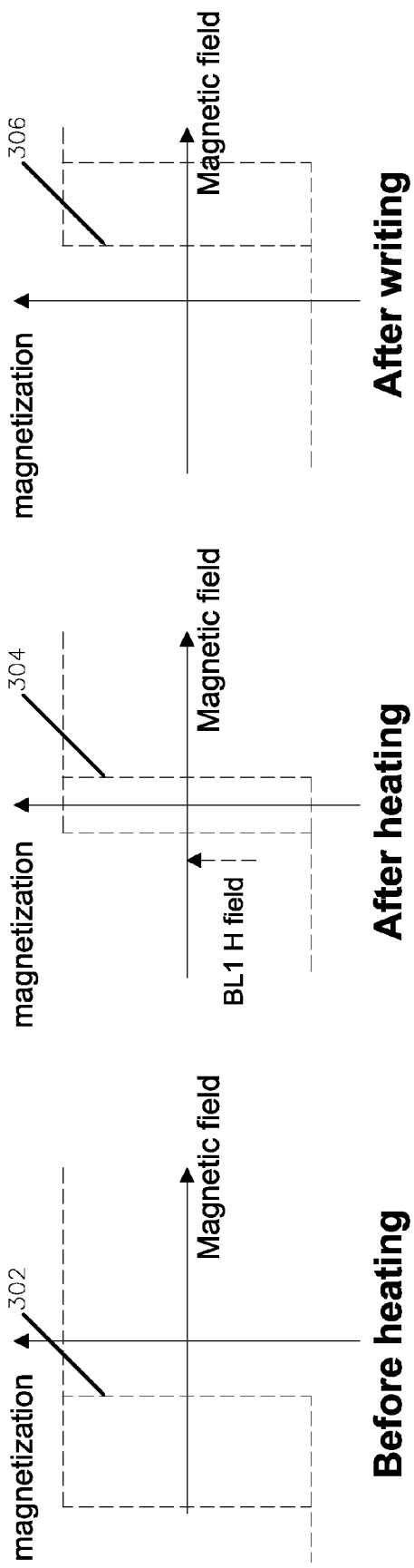
FIGS. 3A through 3C are diagrams illustrating the magnetic hysteresis system for the magnetic memory cell of FIG. 2.

This can be illustrated with the magnetic hysteresis curves at FIGS. 3A to 3C and 4A to 4C. In FIGS. 3A to 3C, the orientation of magnetization of free layer 202 is switched from a positive to a negative. In FIG. 3A, free layer 202 has a positive orientation of magnetization. As can be seen by hysteresis curve 302, it will take a large magnetic field to overcome the coercivity of free layer 202 and switch the orientation of magnetization to a negative magnetization. After thermal plate 104 is heated, as described above, free layer 202 is no longer pinned by thermal plate 104, because thermal plate 104 is now acting as a paramagnet. Accordingly, the magnetic behavior of free layer 202 changes as illustrated by the magnetic hysteresis curve 304 of FIG. 3B. As can be seen in FIG. 3B, it takes a much lower magnetic field to change the magnetization of free layer 202. Thus, while thermal plate 104 is heated, a magnetic field can be applied to free layer 202 in order to switch the magnetization of free layer 202.

Thermal plate 104 can then be allowed to cool down at which point it will resume acting as an anti-ferromagnet. This will cause thermal plate 104 to pin free layer 202 to its new orientation of magnetization. This can be illustrated by hysteresis curve 306 in FIG. 3C. As can be seen, at this point it will again require a large magnetic field to overcome the coercivity of free layer 202.

Figure 4:
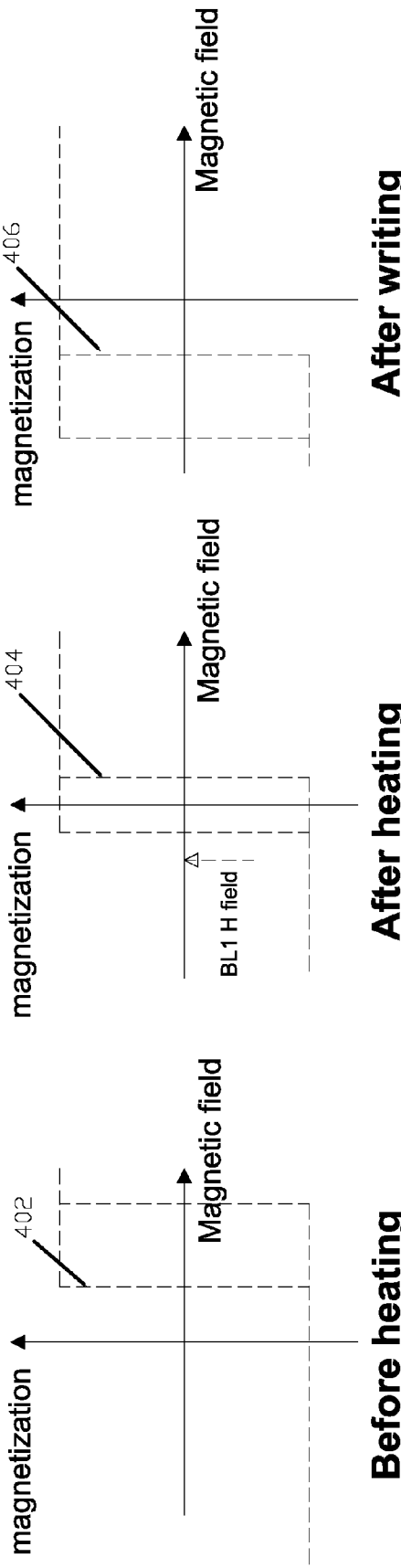
FIGS. 4A through 4C are also diagrams illustrating the magnetic hysteresis for the memory cell of FIG. 2.

FIGS. 4A to 4C illustrate the reverse operation of changing the magnetization of free layer 202 from a negative magnetization to a positive magnetization. Thus, the hysteresis curve 402 of FIG. 4A illustrates that before heating it will take a large magnetic field to alter the magnetization of free layer 202. After heating, the hysteresis curve shifts towards the center of the graph as illustrated by hysteresis curve 404 in FIG. 4B, and a much lower magnetic field can be used to shift the magnetization of free layer 202. After heating, the hysteresis curve will again shift, as illustrated by hysteresis curve 406 in FIG. 4C, and free layer 202 will again be pinned.

The process of shifting the hysteresis curve from left to right or right to left, as illustrated in FIGS. 3A to 3C and FIGS. 4A to 4C, can be referred to as a field-cooling process. Further, the interaction between thermal plate 104 and free layer 202 can be referred to as an exchange bias, or an exchange bias force. Thus, when the exchange bias force is being applied, it takes a large magnetic field to alter the magnetization of free layer 202. When thermal plate 104 is heated, the exchange bias force is eliminated, or overcome, and it takes a much smaller magnetic field to change the magnetization of free layer 202.

Accordingly, by including a thermal plate 104 in the magnetic memory cells of a MRAM device, lower currents can be used to program magnetic memory cells from one state to another. This provides the ability to increase the density and lower power consumption of MRAM devices. Further, because the state of free layer 202 is pinned by thermal plate 104, the state of the memory cell is more stable.

Figure 5:
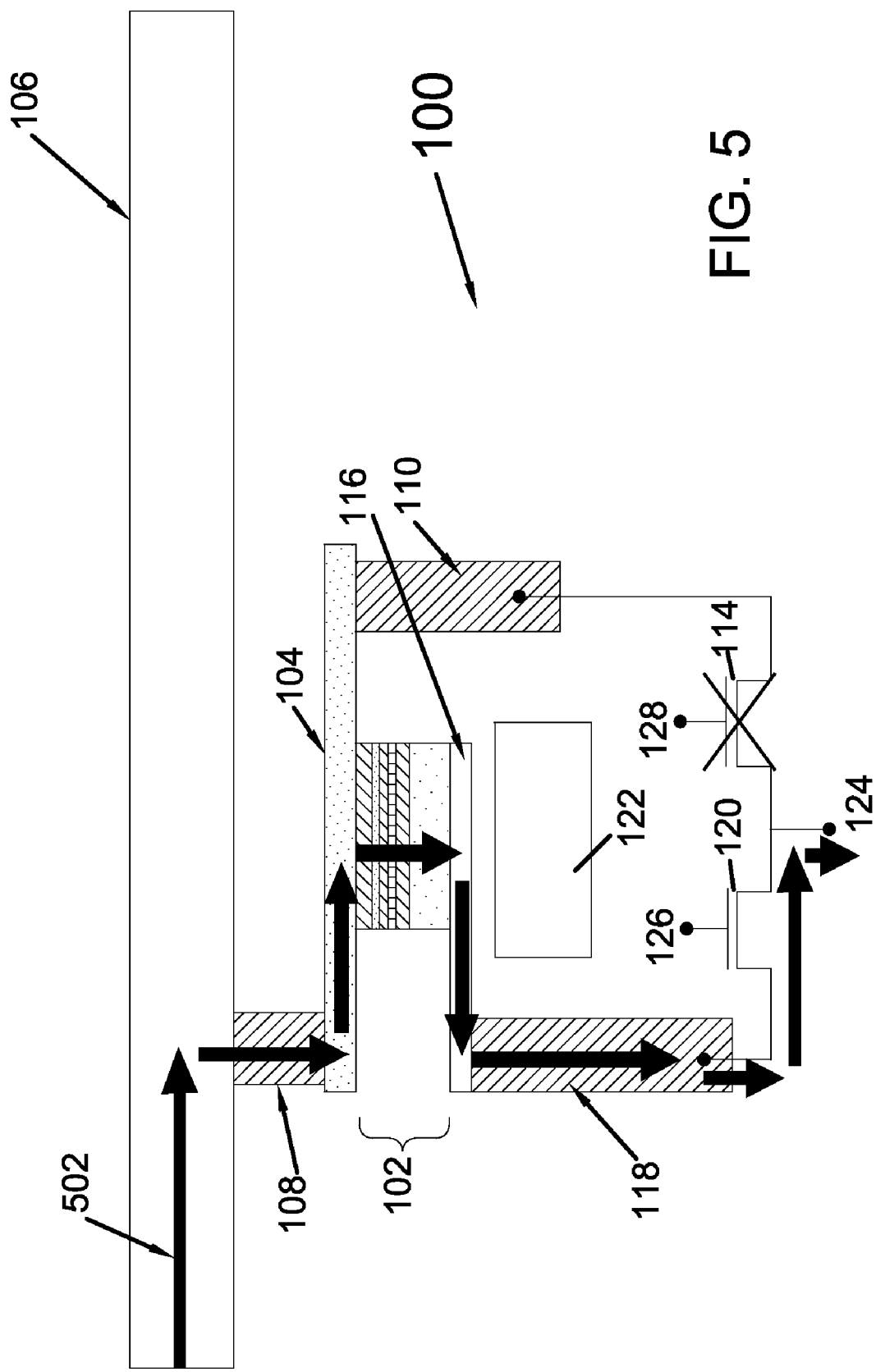
FIG. 5 is a diagram illustrating a read operation for the magnetic memory device of FIG. 1 in accordance with one embodiment.

FIG. 5 is a diagram illustrating one example method for sensing the state of MTJ 102 in accordance with one embodiment. First, transistor 120 is turned on by applying a sensing voltage to word line 126 interfaced with the gate of transistor 120. Transistor 114, and all other word line transistors associated with other cells within magnetic memory device 100 are turned off by applying 0 volts, or a slightly negative voltage to word line 128 coupled with the gate of transistor 114, and to the word lines coupled with the gates of all other transistor associated with the other cells.

A voltage difference is then applied between bit line 106 and common source 124. This voltage difference causes a sensing current 502 to flow through bit line 106 and down to thermal plate 104 through via 108. Sensing current 502 then flows from thermal plate 104 through MTJ 102 to electrode 116, and down to the drain of transistor 120 through contact 118. Current 502 then flows out of common source node 124 where it can be sensed to determine the resistance of MTJ 102.

The direction of current 502 depends on the voltage sign associated with voltage difference applied between bit line 106 and common source 124. Thus, applying a voltage difference opposite to the voltage difference applied in the example of FIG. 5 will cause a current 502 to flow in the opposite directions as illustrated in FIG. 5.

If the orientation of magnetization of free layer 202 is aligned with the orientation magnetization of pinned layer 206, then the resistance of MTJ will be lower than if they are not aligned. By sensing the resistance of MTJ 102, the state of MTJ 102 can be determined.

All other bit lines, except bit line 106 can be left floating or tied to ground. Similarly, all other common source nodes, except common source node 124, can be left floating at tied ground.

During the sensing operation, bit line 122, and all similar bit lines within device 100, are left floating at tied ground.

Figure 6:
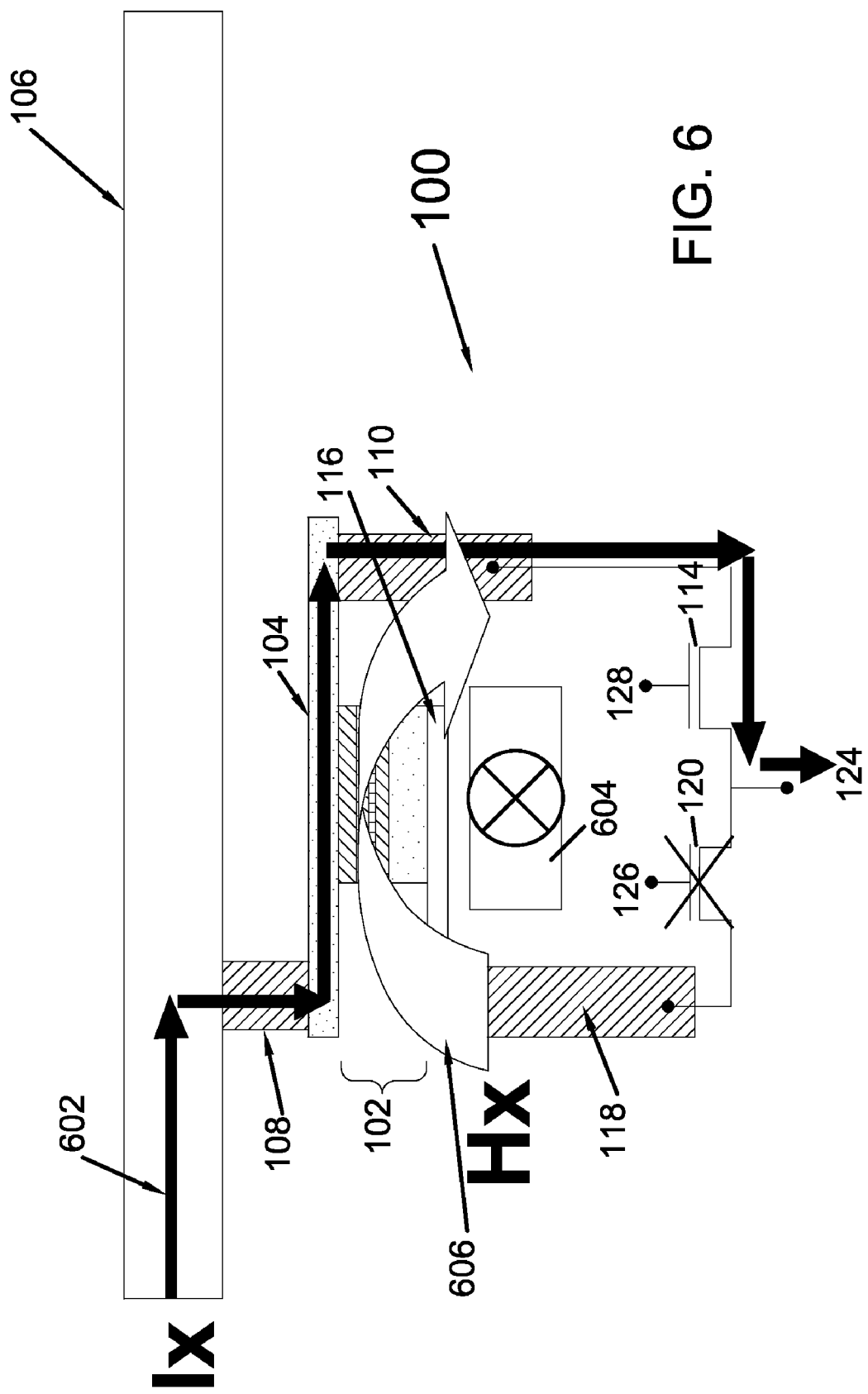
FIG. 6 is a diagram illustrating an example process for programming the logic state of a magnetic memory cell included in the magnetic memory device of FIG. 1.

FIG. 6 is a diagram illustrating an example method of programming the state of MTJ 102 to a logic "1". First, transistor 114 is turned on by applying a voltage to word line 128 coupled with the gate of transistor 114. Transistor 120, and all other transistors associated with other cells within device 100 are turned off by applying zero volts, or a slightly negative voltage to the gate of these transistors. A voltage difference is then created between bit line 106 and common source 124, which generates current 602 through bit line 106. The direction of current 602 will again depend on the sign associated with the voltage difference applied between bit line 106 and common source 124.

In the example of FIG. 6, current 602 flows through bit line 106 and down to thermal plate 104 through via 108. This current will heat thermal plate 104. This heating occurs due to the higher resistance of thermal plate 104. This higher resistance causes most of the voltage drop to occur in thermal plate 104, heating thermal plate 104. The heating power will follow the formula: P=IV.

Current 602 will flow through thermal plate 104 and down to common source 124 through contact 110 and transistor 114. Once thermal plate 104 is heated sufficiently to pass its Néel temperature or blocking temperature a current can be supplied through bit line 122 to generate a magnetic field 606. Magnetic field 606 can be used to change the orientation of magnetization of free layer 202. It will be understood, that when a sufficient magnetic field 606 is supplied, then the direction of magnetization and free layer 202 will follow the direction magnetic field 606.

In the example of FIG. 6, current 604 flowing in bit line 122 is flowing into the page. This creates a magnetic field 606 in the direction illustrated.

After the magnetization of free layer 202 has been altered via magnetic field 606, the voltage difference supplied between bit line 106 and common source 124 can be removed, which will also remove current 602. Current 604 can also be removed. Once current 602 is removed, the temperature of thermal plate 104 will drop below the Néel temperature or blocking temperature and thermal plate 104 will again act as an anti-ferromagnet. This will pin the magnetization of free layer 202 as described above.

During the programming operation of FIG. 6, all bit lines except bit line 106 can be left floating or tied to ground. Similarly, all common source nodes associated with cells within device 100, except common source node 124, can be left floating or tied to ground.

FIG. 7 is a diagram illustrating an example method for changing the state of free layer 202 to a logic "0". The method is similar to that described in relation to FIG. 6; however, the direction of current 704 flowing in bit line 122 is out of the page, i.e., the opposite of current 604 in FIG. 6. This generates a magnetic field 706 in the opposite direction of magnetic field 606 in FIG. 6. This will cause the orientation of magnetization of free layer to the switch to follow the direction of magnetic field 706 and switch relative to the orientation of magnetization produced by the process of FIG. 6.

Again, all bit lines associated with cells included in device 100, except bit line 106, can be left floating or tied to ground as can the common source nodes associated with cells within device 100, with the exception of common source node 124.

It will be understood that the voltages and voltage differences applied in the example described above must be sufficient to produce the currents and magnetic fields described. Accordingly, the voltages and voltage differences applied will depend on the specific requirements for a particular implementation. Nothing associated with the description of the embodiments above should be seen as limiting the embodiments described herein to particular voltages and voltage differences.

Further, the timing associated at generation of a current flow to thermal plate 104 in order to heat thermal plate 104 above its Néel temperature or blocking temperature must be sufficient in order to achieve the requisite temperature. For example, for FeMn, the temperature achieved must be greater than approximately 300° C. Thus, if FeMn is used for thermal plate 104, then a current must be generated within thermal plate 104 for a period long enough to heat thermal plate 104 above approximately 300° C. Accordingly, the time period associated with the generation of the various currents described herein will depend on the requirements of the particular implementation. Nothing included herein should be seen as limiting the time periods to any specific amount of time or to any specific interval. Nor should anything herein be seen as limiting the heating of thermal plate 104 to any particular temperature. Again, thermal plate 104 should be heated sufficiently so that its temperature rises above the Néel temperature or blocking temperature for the particular material being used.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A magnetic memory device, comprising:
   a free layer and a pinning layer;
   an insulating layer and a pinned layer disposed between the free and pinning layers;
   a plate coupled with the free layer; and
   a programming current path that includes the plate but not the free layer.

2. The magnetic memory device of claim 1, wherein the plate is constructed of an anti-ferromagnetic material.

3. The magnetic memory device of claim 2, wherein the anti-ferromagnetic material is XMn or XMn/Y.

4. The magnetic memory device of claim 3, wherein X is one of Pt, Ir, or Fe.

5. The magnetic memory device of claim 3, wherein Y is one of Ru or Ir.

6. The magnetic memory device of claim 1, wherein the pinning layer comprises a synthetic anti-ferromagnetic layer.

7. The magnetic memory device of claim 6, wherein the synthetic anti-ferromagnetic layer comprises CoFe/Ru/CoFe.

8. The magnetic memory device of claim 6, wherein the pinning layer further comprises an anti-ferromagnetic layer.

9. The magnetic memory device of claim 1, wherein the pinned layer material is CoFe.

10. The magnetic memory device of claim 1, wherein the insulator layer comprises Al—O or MgO.

11. The magnetic memory device of claim 1, wherein the free layer material is CoFe.

12. The magnetic memory device of claim 1, further comprising a first bit line coupled with one end of the plate.

13. The magnetic memory device of claim 12, further comprising a pair of word line transistors and a common source node shared between the pair of word line transistors, and wherein the other end of the plate is coupled with the drain of one of the word line transistors.

14. The magnetic memory device of claim 13, wherein the drain of the other word line transistor is coupled with the pinning layer.

15. The magnetic memory device of claim 14, further comprising a second bit line in close proximity to the pinning layer.

16. A magnetic memory device, comprising:
a free layer and a pinning layer;
an insulating layer and a pinned layer disposed between the free and pinning layers;
a plate coupled with the free layer;
a first bit line coupled with the plate; and
a second bit line in close proximity to the pinning layer, the first and the second bit lines being oriented such that they are not in parallel.

17. The magnetic memory device of claim 16, further comprising a pair of word line transistors and a common source node shared between the pair of word line transistors, and wherein the other end of the plate is coupled with the drain of one of the word line transistors.

18. The magnetic memory device of claim 17, wherein the drain of the other word line transistor is coupled with the pinning layer.

19. The magnetic memory device of claim 16, fun her comprising a programming current path that includes the plate but not the free layer and through which a programming current can flow thereby effecting the current temperature of the plate.

* * * * *

UNITED STATES PATENT AND TRADEMARK OFFICE
CERTIFICATE OF CORRECTION

PATENT NO. : 7,684,234 B2  
APPLICATION NO. : 12/252263  
DATED : March 23, 2010  
INVENTOR(S) : Chiahua Ho and Kuang-Yeu Hsieh Page 1 of 1

It is certified that error appears in the above-identified patent and that said Letters Patent is hereby corrected as shown below:

Column 10, Line 21, Claim 19, delete "fun her" and insert in lieu thereof --further--.

Signed and Sealed this

Twenty-seventh Day of April, 2010

David J. Kappos  
*Director of the United States Patent and Trademark Office*